United States Patent [19]

Reekstin et al.

[11] 4,218,503

[45] Aug. 19, 1980

[54] X-RAY LITHOGRAPHIC MASK USING RARE EARTH AND TRANSITION ELEMENT COMPOUNDS AND METHOD OF FABRICATION THEREOF

[75] Inventors: John P. Reekstin; Howard L. Glass, both of Orange, Calif.

[73] Assignee: Rockwell International Corporation, El Sequndo, Calif.

[21] Appl. No.: 10,433

[22] Filed: Feb. 9, 1979

Related U.S. Application Data

[63] Continuation of Ser. No. 857,061, Dec. 2, 1977, abandoned.

[51] Int. Cl.$^2$ .............................. B32B 3/10; B05D 5/06
[52] U.S. Cl. ..................................... 428/195; 250/505; 355/125; 355/133; 427/261; 427/264; 427/270; 427/271; 428/199; 428/209; 428/220; 428/332; 428/913; 430/5; 430/321
[58] Field of Search ............... 428/195, 199, 209, 913, 428/332; 427/264, 270, 271, 261; 355/125, 133; 96/36, 38.3; 250/505

[56] References Cited

U.S. PATENT DOCUMENTS

| | | | |
|---|---|---|---|
| 3,684,569 | 8/1972 | Milgram | 96/38.3 X |
| 3,720,143 | 3/1973 | Hashimoto et al. | 96/38.3 X |
| 3,742,230 | 7/1973 | Spears et al. | 250/65 R |
| 3,743,842 | 7/1973 | Smith et al. | 96/38.3 X |
| 3,758,326 | 9/1973 | Hennings et al. | 96/38.3 X |
| 3,816,223 | 6/1974 | Ohn et al. | 96/38.3 X |
| 3,833,396 | 9/1974 | Kammlott et al. | 96/38.3 X |
| 3,873,824 | 3/1975 | Bean et al. | 250/505 |
| 3,877,810 | 4/1975 | Feldstein | 355/133 |
| 3,892,973 | 7/1975 | Coquin et al. | 250/505 |
| 3,925,079 | 12/1975 | Hager et al. | 96/38.3 X |

*Primary Examiner*—Thomas J. Herbert, Jr.
*Attorney, Agent, or Firm*—H. Fredrick Hamann; Richard A. Bachand; Daniel R. McGlynn

[57] ABSTRACT

There is described a unique mask and method of making same. The mask is especially useful in high resolution fabrication techniques such as in making magnetic bubble domain structures, semiconductor device structures and the like. The mask includes a suitable support of appropriate density to be substantially transparent to various types of radiation such as, but not limited to, E-beams, X-rays and the like. A layer of material which is substantially opaque to the same radiation and which can have the solubility thereof changed by application of E-beams or the like is provided on the support material. The mask is exposed to the solubility changing radiation wherein a pattern is defined in the layer, the layer is etched in a non-critical etch so that the soluble portion thereof is removed and the remaining material provides a suitable pattern. To the extent necessary, a suitable auxiliary support member can be provided to the support.

4 Claims, No Drawings

X-RAY LITHOGRAPHIC MASK USING RARE EARTH AND TRANSITION ELEMENT COMPOUNDS AND METHOD OF FABRICATION THEREOF

This is a continuation of application Ser. No. 857,061 filed Dec. 2, 1977, now abandoned.

BACKGROUND OF THE INVENTION

1. Field of the Invention

This invention is directed to high resolution fabrication techniques, in general, and, more particularly, to a mask and method of making the mask for use in implementing the high resolution fabrication techniques.

2. Prior Art

In fabricating many devices of high resolution, such as magnetic bubble domain structures, semiconductor device structures, and the like, various techniques have been developed to improve the density and the resolution of the structures. These techniques include, inter alia, E-beam and X-ray lithography. These techniques have been used in replicating or fabricating microcircuits capable of resolution of better than 0.1 microns. In the past, however, the resolution has been limited primarily by two factors, viz. (1) the required thickness of a heavy metal absorber for absorbing the radiation from the source in order to provide adequate contrast and (2) the range of the electrons or photons produced by absorption of the X-rays or electrons in the mask resist. That is, the thickness of the absorber which is required generally limits the achievable line width inasmuch as the thickness/width aspect ratio of the absorber is generally limited to one or two.

In addition, various techniques of making masks for use in X-ray lithography have been described. However, for the most part, these masks are directed at complex, sophisticated techniques for placing materials on a suitable membrane and operating on the materials and/or the membrane to establish a suitable masking technique. In addition, these techniques frequently require a plurality of other masking stages using photoresist or the like with the resultant increase in cost of the masks and the decrease in yield of masks. It is, therefore, highly desirable to establish techniques for making high resolution lithographic masks in a manner which is as simple and inexpensive as possible.

Prior Art Statement

The prior art which has been discovered by applicant and which is believed to be the most pertinent art is listed herewith.

U.S. Pat. No. 3,742,230; Soft X-Ray Mask Support Substrate; Spears et al is directed at a support substrate for making a soft x-ray mask wherein a thin taut silicon membrane is carried by a thick silicon peripheral support structure with the thin membrane being doped with a material having a smaller covalent bond radius than silicon whereby the membrane will be caused to shrink and become taut.

U.S. Pat. No. 3,873,824; X-Ray Lithography Mask; Bean et al is directed at a method of forming a mask for x-ray lithography wherein a layer of silicon carbide is deposited on a suitable substrate and the substrate is etched away to leave the silicon carbide as an x-ray transmissive window.

U.S. Pat. No. 3,892,973; Silicon Mask Structure for X-Ray Lithography; Coquin et al is directed to an x-ray lithographic mask using a substrate of Mylar stretched over and bonded to a support ring with an x-ray absorptive pattern disposed thereon.

U.S. patent application Ser. No. 810,469 filed June 27, 1977, now abandoned; High Resolution Mask and Method of Fabrication Thereof; Jones; which is directed to a method of making a mask using a polymer membrane with an x-ray absorptive pattern thereon.

All of the foregoing information is incorporated herein by reference.

SUMMARY OF THE INVENTION

There is described a mask and method of making same which is useful in high resolution lithographic techniques. The mask comprises a suitable energy or x-ray transparent substrate and a pattern formed thereon. The pattern is formed of suitable material, such as rare earth, which is absorptive of x-rays or other radiation applied thereto. In addition, the layer of material is capable of having the solubility thereof altered as a function of E-beam or other energy radiation. After the material is treated by the radiation which effects the solubility thereof it is etched by a suitable solvent. Thus, a prescribed pattern of x-ray absorptive material is produced on the substrate.

DESCRIPTION OF A PREFERRED EMBODIMENT

In fabricating the mask of the instant invention, a suitable substrate is initially provided. In substrate may be fabricated of Mylar, silicon or other suitable material which is substantially transparent to x-rays or other (actinic) radiation which is to be used in the subsequent processes. The material of the substrate is sufficiently thin to enhance the transparency thereof but is of sufficient thickness to act as a reasonable support for the mask. Of course, it is possible to provide an auxiliary support ring such as described in several of the references noted in the Prior Art Statement supra.

A layer of suitable masking materials such as rare earth compounds, rare earth oxides, mixed rare earth oxides and transition elements compounds or the like which have certain properties are then applied to the substrate. Typically, the masking layer is on the order of 5000 Å although the invention is not so limited. The properties of the masking material include being highly absorptive to x-rays or other energy radiation which is to be applied to a work surface via the mask. For example, the mask is absorptive of photon energy of x-rays with a wavelength of 4–40 Å. In the past, gold has been used in this manner. However, the masking material also has the property or characteristic that when exposed to suitable energy radiation, such as E-beams, the stoichiometry of the material is altered. Of course, the material must be relatively stable over the time required in preparing the mask. An example, which is not particularly useful in making x-ray masks, is the alteration of $Fe_2O_3$ to either $FeO$ or $Fe_3O_4$ when it is exposed to an electron beam pattern generator (see U.S. Pat. No. 3,833,396)

The aforesaid exposure causes certain areas of the masking layer to have a different chemical and/or structural configuration and, therefore, different chemical properties. Among the changes in the chemical properties is the change in solubility of the exposed areas.

After the layer of masking material is disposed on the substrate, it is exposed to an appropriate radiation, such as E-beams or the like. This exposure may be accomplished by using an E-beam generator, or the like, which is programmed to define the desired pattern in the layer. The exposure has the effect of altering the solubility of the material which forms the layer. That is, the exposed portion can be made more readily soluble such that it can be removed more readily (or vice versa). The portion to be removed can be arranged to provide either a positive or negative mask as desired.

Examples of suitable materials, which are illustrative rather than limitative, are oxides of tungsten (W), molybdenum (Mo), tantalum (Ta), niobium (Nb), europium (Eu) and other materials which fulfill the requirements noted above.

As an illustration, $WO_2$ is soluble in acid while $W_2O_5$, $W_4O_{11}$ or $WO_3$ are insoluble in acid (Handbook of Chemistry and Physics).

Similarly, $MoO_2$, $Mo_2O_5$, $MoO_3$ are soluble in acids while $Mo_2O_3$ is insoluble in acid.

Typically, the radiation exposure of the masking material effects an oxygen deficiency therein and, thus, alters the stoichiometry thereof.

After the masking material has been exposed to the radiation, as for example in an electron beam pattern generator, it is then exposed to an appropriate etchant or solvent such as dilute HCl. Because of the change brought about by the exposure of the masking material, some part or parts of the masking material layer will be readily etched or removed while the remainder will be less readily affected. Typically, it is expected that the solubility of the material must be affected such that an etching rate differential of approximately 10 times would be required. That is, the soluble portions should etch about 10 times as rapidly as the non-soluble portions. An etching rate much less than 10 times would provide insufficient distinction between the materials and a high resolution, fine line lithographic mask would not be provided.

As noted, the substrate can be formed of any suitable material. In the event that the substrate is made of a limp, flaccid material, an auxiliary support structure or ring can be utilized as described above.

Thus, there has been described a lithographic mask. This mask is useful in fine line lithography and assists in printing submicron geometries onto a suitable substrate wafer material. The mask is fabricated in a relatively simple manner without the requirement of any intermediate resist masking steps, without any release agents, and without a plurality of operating steps. The mask is relatively simple and reasonably inexpensive to fabricate. Unusual or unknown techniques are not required to be developed and explored in fabricating this mask.

Having thus described a preferred embodiment of the instant invention, what is claimed is:

1. A high resolution mask formed by the steps of;
   providing a substrate which is substantially transparent to x-ray radiation,
   disposing a layer of masking material on a surface of said substrate which masking material is substantially opaque to x-ray radiation,
   said masking material is selected from the class comprising rare earth compounds, rare earth oxides, mixed rare earth oxides, and transition element compounds,
   directly exposing portions of said layer to E-beam radiation to alter the solubility of the exposed portions of the said layer, and
   applying a solvent to said layer to remove parts thereof which are readily soluble in said solvent thereby to establish a pattern of said layer on said substrate.

2. The mask recited in claim 1 wherein,
   said layer of masking material is less than about 5000 Å thick.

3. The mask recited in claim 1 including the step of providing an auxiliary support means for said substrate.

4. The mask recited in claim 1 wherein
   said patterned layer comprises oxides of tungsten, molybdenum, tantalum, niobium, and europium individually or in combination.

* * * * *